(12) United States Patent
Crippa et al.

(10) Patent No.: US 11,293,941 B2
(45) Date of Patent: Apr. 5, 2022

(54) INTERFACE ELEMENT FOR A TESTING APPARATUS OF ELECTRONIC DEVICES AND CORRESPONDING MANUFACTURING METHOD

(71) Applicant: Technoprobe S.p.A., Cernusco Lombardone (IT)

(72) Inventors: Roberto Crippa, Cernusco Lombardone (IT); Riccardo Vettori, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 0 days.

(21) Appl. No.: 16/808,305

(22) Filed: Mar. 3, 2020

(65) Prior Publication Data

US 2020/0200795 A1 Jun. 25, 2020

Related U.S. Application Data

(63) Continuation-in-part of application No. PCT/EP2018/073187, filed on Aug. 29, 2018.

(30) Foreign Application Priority Data

Sep. 7, 2017 (IT) .......................... 102017000100522

(51) Int. Cl.
*G01R 1/02* (2006.01)
*G01R 1/04* (2006.01)
*G01R 1/067* (2006.01)

(52) U.S. Cl.
CPC ........... *G01R 1/025* (2013.01); *G01R 1/0416* (2013.01); *G01R 1/06716* (2013.01)

(58) Field of Classification Search
CPC .. G01R 1/025; G01R 1/0416; G01R 1/06716; G01R 3/00; G01R 1/07314; G01R 1/06755; G01R 1/07371
USPC .......................... 324/537, 531, 544, 557, 500
See application file for complete search history.

(56) References Cited

U.S. PATENT DOCUMENTS

| | | | | |
|---|---|---|---|---|
| 5,624,268 A * | 4/1997 | Maeda | ............... | H01L 23/49827 439/66 |
| 5,785,538 A * | 7/1998 | Beaman | ............. | G01R 1/07357 439/66 |
| 6,069,482 A * | 5/2000 | Hilton | .................. | G01R 1/0483 324/755.08 |
| 6,280,207 B1 * | 8/2001 | Sakata | ............... | H01R 13/2414 439/591 |

(Continued)

FOREIGN PATENT DOCUMENTS

| | | |
|---|---|---|
| EP | 1 156 707 | 11/2001 |
| WO | 02/15653 | 2/2002 |
| WO | 2004/039135 | 5/2004 |

*Primary Examiner* — Giovanni Astacio-Oquendo
(74) *Attorney, Agent, or Firm* — Seed Intellectual Property Law Group LLP (57) ABSTRACT

An interface element (20) for a testing apparatus of electronic devices comprises at least one support (21) provided with a plurality of through-openings (22) that house respective interconnections elements (23), which extend between a first end (23*a*) and a second end (23*b*). Suitably, the interconnections elements (23) are made of a conductive elastomer that fills the openings (22) of the support (21), each of the interconnection elements (23) forming a conductive channel between different and opposing faces (Fa, Fb) of the support (21).

16 Claims, 11 Drawing Sheets

(56) References Cited

U.S. PATENT DOCUMENTS

| | | | |
|---|---|---|---|
| 6,574,114 B1 | 6/2003 | Brindle et al. | |
| 10,178,766 B2 * | 1/2019 | Takahashi | H05K 3/303 |
| 2002/0127893 A1 | 9/2002 | Brodsky | |
| 2002/0191406 A1 | 12/2002 | Hashitani et al. | |
| 2006/0134378 A1 * | 6/2006 | Kimura | G01R 1/0735 |
| | | | 428/137 |
| 2007/0057382 A1 * | 3/2007 | Liu | H05K 3/3436 |
| | | | 257/780 |
| 2007/0298626 A1 | 12/2007 | Hougham et al. | |
| 2008/0297182 A1 * | 12/2008 | Karklin | G01R 1/07378 |
| | | | 324/762.06 |
| 2009/0039905 A1 * | 2/2009 | Kimura | G01R 1/07378 |
| | | | 324/755.08 |
| 2011/0074455 A1 | 3/2011 | Nakata et al. | |
| 2011/0121847 A1 | 5/2011 | Umemura | |
| 2013/0069683 A1 * | 3/2013 | Kuo | H05K 3/00 |
| | | | 324/755.03 |
| 2014/0232427 A1 * | 8/2014 | Namburi | G01R 1/06716 |
| | | | 324/755.08 |
| 2014/0370727 A1 | 12/2014 | Palaniappa et al. | |
| 2015/0015288 A1 * | 1/2015 | Ma | G01R 1/06738 |
| | | | 324/754.03 |
| 2020/0141978 A1 * | 5/2020 | Ishimatsu | G01R 3/00 |

\* cited by examiner

INTERFACE ELEMENT FOR A TESTING APPARATUS OF ELECTRONIC DEVICES AND CORRESPONDING MANUFACTURING METHOD

BACKGROUND

Technical Field

The present disclosure refers to an interface element for a testing apparatus of electronic devices integrated on a semiconductor wafer, and the following description is made with reference to this field of application with the sole aim of simplifying the description thereof.

Description of the Related Art

As it is well known, a probe card is an electronic device adapted to electrically connect a plurality of contact pads of a microstructure, such as a device integrated on a semiconductor wafer, with corresponding channels of a testing machine that performs the functionality testing thereof, in particular the electric testing, or the test, generically.

The test, which is performed on integrated devices, is particularly useful in detecting and isolating defective devices as early as in the manufacturing phase. Normally probe cards are therefore employed for the electric test of devices integrated on wafers before cutting and assembling them inside a containment package.

Generally, a probe card comprises a testing head, including in turn a plurality of contact elements or contact probes held by a pair of guides which are substantially plate-shaped and parallel to each other. The guides are equipped with suitable guide holes and are arranged at a certain distance from each other in order to leave a free space for the movement and possible deformation of the contact probes, which are slidably housed in the guide holes. The pair of guides comprises in particular an upper guide and a lower guide, both provided with guide holes within which the contact probes axially slide, which are usually formed by wires of special alloys with good electric and mechanical properties.

Good connection between the contact probes and the contact pads of the device under test is ensured by the pressure of the testing head on the device itself, the contact probes undergoing, during the pressing contact, a bending inside the air gap between the guides and a sliding inside the corresponding guide holes. Testing heads of this kind are commonly called "testing heads with vertical probes" and indicated with the term "vertical probe head".

Figure 1:
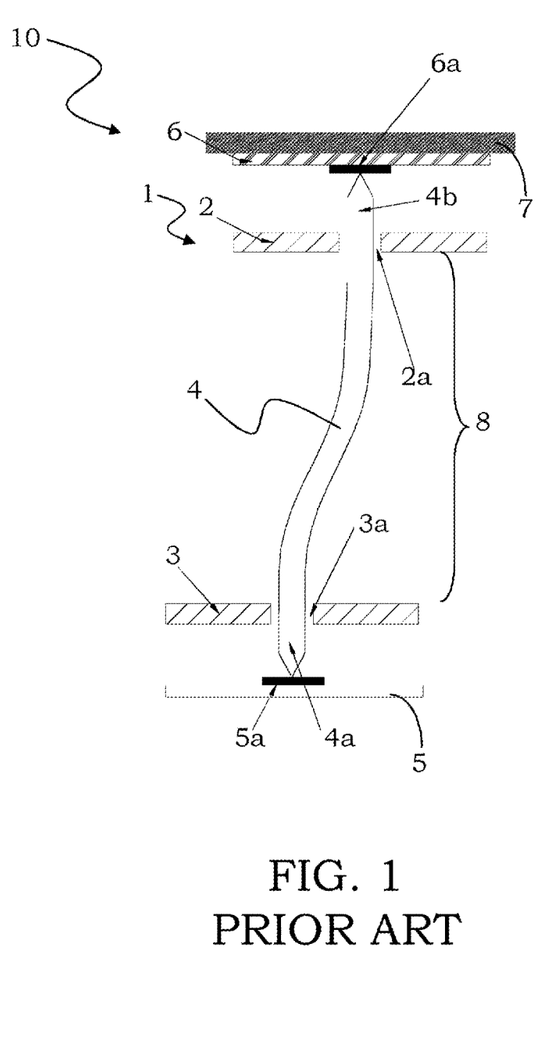
FIG. 1 schematically shows a probe card realised according to the prior art.

Substantially, the vertical probe heads have an air gap in which a bending of the contact probes occurs, the bending can be helped by means of a suitable configuration of the probes themselves or of the guides thereof, as schematically illustrated in FIG. 1.

In particular, FIG. 1 schematically illustrates a probe card 10 comprising a testing head 1, including in turn an upper guide 2, usually indicated as "upper die", and a lower guide 3, usually indicated as "lower die", separated by an air gap 8, having respective guide holes 2a and 3a within which a plurality of contact probes 4 slides, just one probe of the plurality of contact probes being shown for the sake of simplicity in FIG. 1.

Each contact probe 4 has at one end a contact tip 4a intended to abut onto a contact pad 5a of a device under test integrated on a wafer 5, so as to provide the mechanical and electric contact between the device under test and a testing apparatus (not shown), which the testing head 1 forms a terminal element of.

The term "contact tip" indicates, here and in the following, an end area or region of a contact probe intended to contact a contact pad of the device under test, the end area or region not being necessarily pointed.

In some cases, the contact probes are fixedly fastened to the testing head at the upper plate-like support: they are referred to as testing heads with "blocked probes".

However, more frequently testing heads having not fixedly fastened probes, but held interfaced to a so-called board, possibly through a microcontacter equipped with a plurality of contact pads, are used: they are referred to as testing heads with "not blocked probes". The microcontacter is usually called "space transformer" since, in addition to the contact with the probes, it also allows spatially redistributing the contact pads formed thereon with respect to the contact pads of the device under test, in particular through a loosening of the distance constraints between the centers of the pads themselves.

In this case, as illustrated in FIG. 1, each contact probe 4 has a further end area or region which ends with a so-called contact head 4b towards a contact pad 6a of a plurality of contact pads of a space transformer 6 comprised in the probe card 10. Good electric contact between probes 4 and space transformer 6 is ensured by pressing the contact heads 4b of the contact probes 4 onto the contact pads 6a of the space transformer 6 analogously to the contact between the contact tips 4a and the contact pads 5a of the device under test integrated on a wafer 5.

Generally, the probe card 10 further comprises a support plate 7 (for instance a PCB card), which is in contact with the space transformer 6 and is adapted to interface the probe card 10 with the testing apparatus.

The correct operation of a probe card is fundamentally linked to two parameters: the vertical movement, or overtravel, of the contact probes and the horizontal movement, or scrub, of the contact tips of the contact probes on the contact pads.

All these features are to be evaluated and calibrated during the manufacturing phase of a probe card, since the good electric connection between probes and device under test should always be ensured.

Equally important is to ensure that the pressing contact of the contact tips of the probes onto the contact pads of the device is not so high as to cause the breakage of the probe or of the pad itself.

This problem is strongly felt in the case of the so-called short probes, namely probes with limited body height, in particular with dimensions less than 5000 μm. Probes of this type are for instance used for high-frequency applications, the reduced length of the probes limiting the related self-inductance phenomenon and increasing the performance of the probe card. In particular, the term "probes for high-frequency applications" indicates probes capable of carrying signals with frequencies greater than 1 GHz.

Indeed, the recent need is well known of producing probe cards capable of carrying signals at ever higher frequencies up to radiofrequencies, with the consequent need of a drastic reduction in length of the contact probes to allow such high-frequency signals to be carried without adding noise, for instance due to the above-mentioned self-inductance phenomenon.

However, in this case, the reduced length of the body of the probes dramatically increases the stiffness of the probe itself, which implies an increase in the force applied by the corresponding contact tip onto the contact pads of a device under test, which can also lead to the breakage of the pads, with an irreparable damage to the device under test, a situation which obviously should be avoided. Even more dangerously, the increase in the stiffness of the contact probe due to the reduction in the length of its body also increases the risk of breakage of the probes themselves.

Therefore, there is the need to provide an interface element for a testing apparatus of electronic devices having structural and functional features such as to allow overcoming the limitations and drawbacks which still nowadays affect the known solutions, in particular able to interface in a simple manner with a probe card, thus allowing the test of high-frequency electronic devices without adding noise to the carried signals and eliminating the risk of breakage of its contact elements and of the contact pads of the electronic devices under test.

Moreover, it would be desirable to provide an interface element of the above indicated type through a simple and quick manufacturing process.

BRIEF SUMMARY

The present disclosure provides an interface element for a probe card filling a plurality of through-openings formed in a support thereof with a conductive elastomer, whose end portions are adapted to contact contact pads of a device under test and/or of components of the probe card which the interface element is associated with, the pressure of the conductive elastomer onto the contact pads allowing the desired mechanical and electric connection.

More in particular, an exemplary interface element for a testing apparatus of electronic device comprises at least one support equipped with a plurality of through-openings which house respective interconnection elements extending between a first end and a second end, wherein the interconnection elements are made of a conductive elastomer that fills the openings of the support, each of the interconnection elements forming a conductive channel between different and opposing faces of the support.

More particularly, the disclosure comprises the following additional and optional features, taken singularly or in combination if needed.

According to an aspect of the present disclosure, at least one of the first end and the second end of the interconnection elements may protrude from the openings.

According to another aspect of the present disclosure, the end protruding from the openings can have a section that is less than a section of a portion of the interconnection elements housed inside the openings.

Furthermore, a terminal portion of the end protruding from the openings may comprise a coating metal portion.

According to another aspect of the present disclosure, at least one of the ends of the interconnection elements may comprise a conductive contact element, a first end portion of the conductive contact element being inserted in the at least one of said ends and a second end portion, opposite the first end portion, of the conductive contact element protruding from the at least one of said ends.

In particular, the interconnection elements may have a length comprised between 100 µm and 300 µm, said length being measured along a longitudinal axis of the interconnection elements.

Furthermore, the conductive elastomer forming the interconnection elements may comprise an elastomeric material including in turn micro or nano particles of conductive material.

According to an aspect of the present disclosure, at least one portion of the walls of the openings may be coated by a conductive portion.

According to another aspect of the present disclosure, one of the ends of the interconnection elements may be adapted to contact contact pads of a device under test and the other end of the interconnection elements may be adapted to contact contact pads of a space transformer associated with the interface element.

Alternatively, the ends of the interconnection elements may be adapted to contact contact pads of components associated with the interface element and between which the interface element is arranged, the interface element providing the mechanical and electric connection among said components.

The present disclosure also refers to a probe card for a testing apparatus of electronic devices, characterized by comprising at least one interface element according to the present disclosure, the at least one interface element being adapted to perform the contact with contact pads of a device under test by means of the interconnection elements and/or by acting as an electric and mechanical connection element among different components of the probe card.

In particular, the interface element can be arranged between a space transformer and a testing head that comprises a plurality of contact probes extending between a tip portion adapted to contact the contact pads of the device under test and a head portion and are housed in guide holes of at least one guide, the head portion of the contact probes being associated with the first end of the interconnection elements.

According to an aspect of the present disclosure, the contact probes may be T-shaped, wherein the head of the T corresponds to the head portion of the contact probes and is adapted to abut onto the first protruding end of the interconnection elements.

The present disclosure also refers to a method for manufacturing an interface element for a testing apparatus of electronic devices, the method comprising at least the steps of:
  providing a substantially plate-like support;
  forming a plurality of through-openings in the support; and
  filling the openings by means of a conductive elastomer, thus forming a plurality of interconnection elements housed in the openings, the interconnection elements extending between a first end and a second end, wherein each of the interconnection elements forms a conductive channel between different and opposing faces of the support.

According to an aspect of the present disclosure, the step of filling the openings may be preceded by a step of arranging a mask onto at least one of the faces of the support, the mask being provided with openings at the openings of the support.

According to another aspect of the present disclosure, the method may comprise a step of selecting a thickness of the mask in order to select a length of the protruding ends, and/or of selecting a diameter of the openings of the mask in order to select a section of the protruding ends.

Furthermore, the step of filling the openings of the support may be performed through a polymerization process. In particular, the polymerization process may be performed by means of thermal cycles.

Finally, the method may further comprise a step of depositing a conductive portion onto at least one portion of the walls of the openings of the support.

The features and advantages of the interface element and of the method according to the disclosure will be apparent from the following description of an embodiment thereof, given by non-limiting example, with reference to the accompanying drawings.

DETAILED DESCRIPTION

Figure 2:
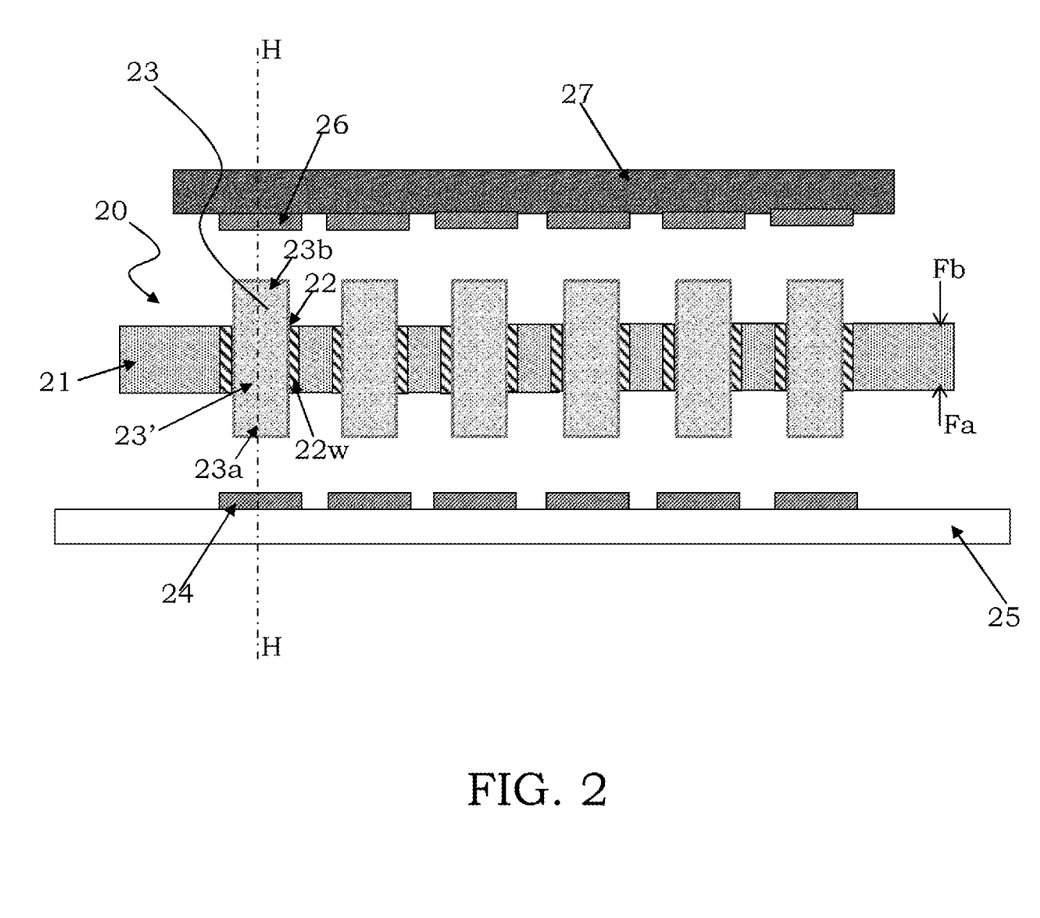
FIG. 2 schematically shows in section an interface element realised according to the present disclosure.

With reference to said figures, and in particular to FIG. 2, reference number 20 globally and schematically indicates an interface element for a testing apparatus of electronic devices integrated on a semiconductor wafer realised according to the present disclosure.

It is worth noticing that the figures represent schematic views and are not drawn to scale, instead they are drawn so as to enhance the important features of the disclosure. Furthermore, in the figures, the different elements are shown schematically, since their shape may vary according to the desired application. It should also be noticed that in the figures identical reference numbers refer to elements identical in shape or function. Finally, particular expedients described in connection with an embodiment illustrated in a figure can also be used for the other embodiments illustrated in the other figures.

As shown in FIG. 2, the interface element 20 comprises at least one support or substrate 21 that is substantially plate-like and equipped with a plurality of through-openings 22 formed between different and opposing faces of the support 21, in particular between two opposing faces thereof, Fa and Fb, face Fa being a lower face and face Fb being an upper face according to the local reference of the figures.

The support 21 is made of a ceramic material or alternatively of a polyamide material, such as for instance Kapton or Mylar, even if other suitable materials are obviously possible, the subject matter of the present disclosure not being limited to a determined kind of material for the support 21.

The openings 22 of the support 21 are adapted to house a respective plurality of interconnection elements, which are all indicated in the present description with reference number 23.

Even if FIG. 2 only shows six interconnection elements 23 for the sake of simplicity, it is apparent that the interface element 20 may comprise a number of interconnection elements 23 which varies according to the needs and/or circumstances, the figures being provided just by way of non-limiting example of the present disclosure.

As shown in FIG. 2, in a preferred embodiment, the interconnection elements 23 of the interface element 20 are adapted to contact contact pads 24 of a device under test integrated on a semiconductor wafer 25, thus ensuring the electric connection of the contact pads 24 with contact pads 26 of a space transformer 27. In other terms, the interface element 20 acts as a testing head to ensure the contact with the device under test, the interconnection elements 23 having opposite ends adapted to contact the contact pads 24 of the device under test and the contact pads 26 of the space transformer 27, as it will be illustrated in greater detail in the following.

However, it is pointed out that the subject matter of the present disclosure is not limited to the above exposed application, since the interface element 20 can also be used in a probe card as an electric and mechanical connection element among different components between which it is arranged. Consequently, the interface element 20 can also be adapted to contact contact pads of additional components of a probe card which it is associated with (for instance interposed).

In any case, though not limited to a particular application and arrangement, the interface element 20 of the present disclosure will be illustrated in the following mainly in connection with the preferred application thereof, wherein the interconnection elements 23 are adapted to contact the contact pads 24 of the device under test.

Advantageously according to the present disclosure, the interconnection elements 23 are made of a conductive elastomer that fills the openings 22 of the support 21. In other terms, the interconnection elements 23 are formed by filling the openings 22 of the support 21, for instance by depositing an elastomeric material into the openings 22, in accordance with a method that will be illustrated later.

In this way, each of the interconnection elements 23 forms a conductive channel between different and opposing faces of the support 21, in particular between the two opposing faces Fa and Fb.

Specifically, the interconnection elements 23 extend between a first end 23a and a second end 23b, opposite the first end 23a, which are intended to contact the contact pads 24 with the device under test and the contact pads 26 of the space transformer 27, respectively. In the example of the figures, the first end 23a is the end at the face Fa of the support 21, whereas the second end 23b is the end at the face Fb of the support 21.

The ends 23a and 23b of the interconnection elements 23 are free ends, the term "free ends" meaning here and in the following an end (be it a body portion of the interconnection elements 23 or a single face thereof) not in contact with the walls of the openings 22 of the support 21.

The ends 23a and 23b of the interconnection elements 23 preferably protrude from the openings 22 of the support 21, so as to ensure the contact of the interconnection elements 23 with the contact pads 24 of the device under test and with the contact pads 26 of the space transformer 27. Consequently, in order to ensure the desired mechanical and electric connection, the interconnection elements 23 comprise at least one end protruding from the openings 22, preferably both the ends protruding from the openings 22.

In the example of FIG. 2, the ends 23a and 23b are the end portions of a body 23' of the interconnection elements 23 extending therebetween along a longitudinal axis, indicated in the figure as axis H-H, even if other configurations are obviously possible.

Figure 3A:
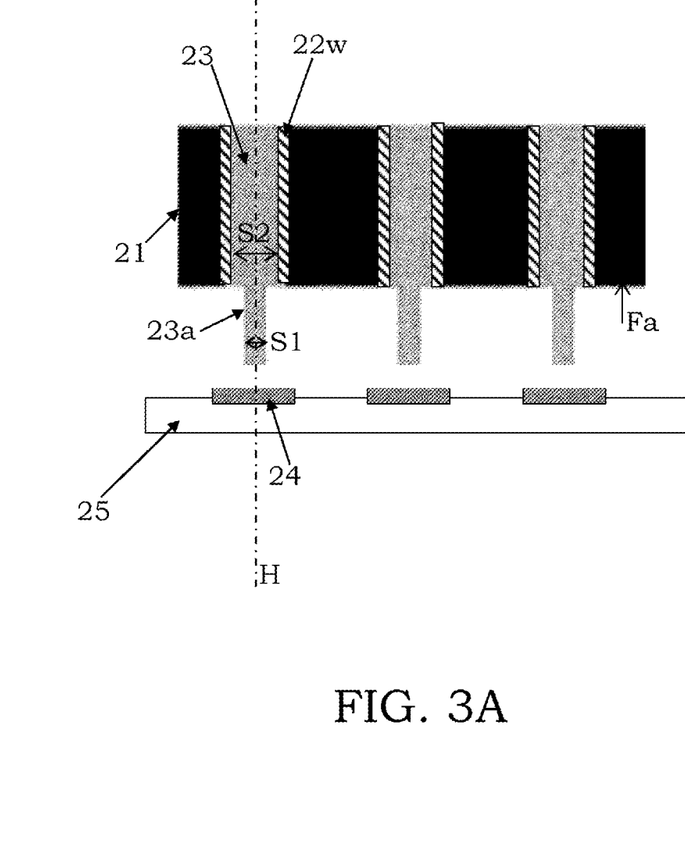
FIGS. 3A and 3B schematically show a detail of the interface element according to a preferred embodiment of the present disclosure, in a rest condition and in a pressing condition onto contact pads of a device under test, respectively.
Figure 3B:
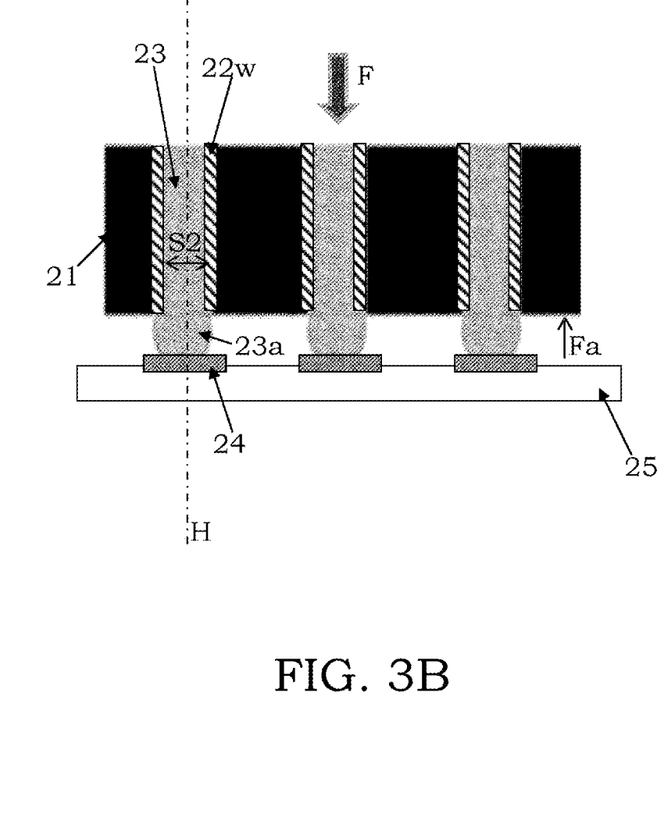

In a preferred embodiment, illustrated in FIGS. 3A and 3B, the protruding ends 23a and 23b (the end 23a in the example of the figure, which only shows a portion of the interface element 20) have a section S1 that is less than a section S2 of the portion of the interconnection elements 23 that is housed inside the openings 22. In other terms, the ends 23a and 23b of the interconnection elements 23 are shaped so as to have a section S1 that is less than the section S2 of the body 23' of the interconnection elements 23. It is noticed that, in the present description, the term "section" means a dimension of the interconnection elements 23 measured in a transversal direction, i.e. a direction orthogonal to the longitudinal axis H-H of the interconnection elements 23.

This embodiment is particularly advantageous since, on occasion of the pressing of the interface element 20, in particular of the ends 23a and 23b, onto the contact pads of a device under test and of the space transformer, the protruding ends 23a and 23b deform, in particular they have a bulging, as shown in greater detail in FIG. 3B, and therefore they greatly increase their transversal section. If the ends 23a and 23b were not provided with a section S1 less than the section S2 of the body 23' of the interconnection elements 23, further measures should be adopted to prevent their bulging from causing a short-circuit between adjacent interconnection elements 23, in particular spacing apart the interconnection elements 23 from each other, which is not optimal in case of applications in which low-pitch devices are tested (for instance less than 150 µm). Instead, the reduced section S1 of the ends 23a and 23b in a rest condition allows a deformation thereof such as there is no electric connection between adjacent interconnection elements 23 while pressing onto the contact pads 24 of the device under test, even with low-pitch, said pressing being indicated in the figures with the arrow F.

It is further noticed that at least one portion of the walls of the openings 22 is coated by a conductive portion 22w. Preferably, the entire wall of the openings 22 is metallized through the conductive portion 22w. Suitably, the metallized wall ensures a proper electric conductivity of the conductive channel formed by the interconnection elements 23 between the faces of the support 21. It is in fact noticed that the electric conductivity of the interconnection elements 23 varies according to their compression, the compression being more limited for the portion of the interconnection elements 23 inside the openings 22 compared to the one suffered by the protruding ends 23a and 23b thereof.

Figure 4A:
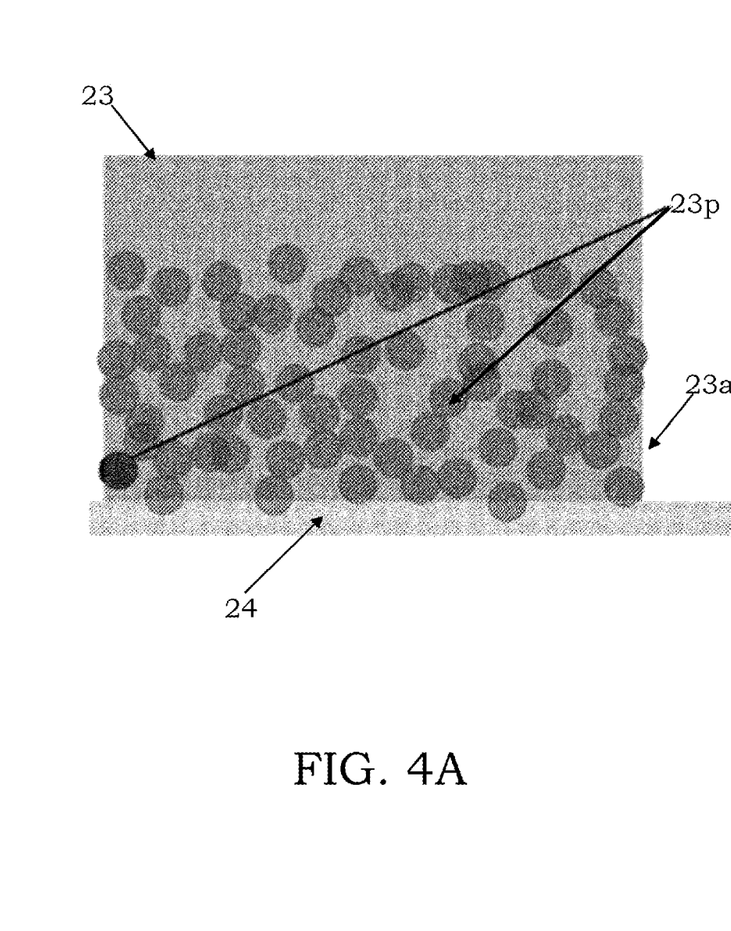
FIGS. 4A and 4B schematically show a detail of an interconnection element of the interface element of the present disclosure in a rest condition and in a pressing condition onto contact pads of a device under test, respectively.
Figure 4B:
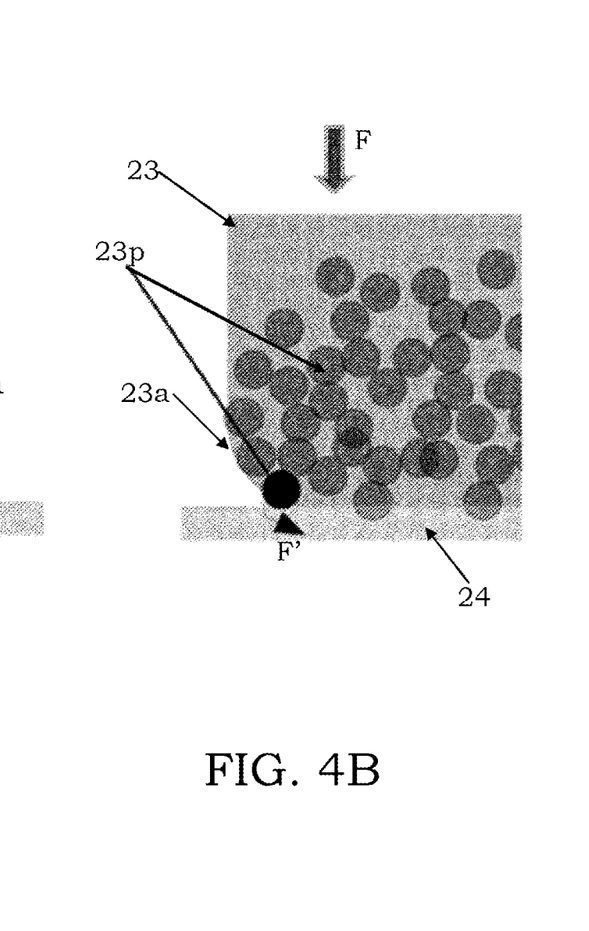

In fact, the conductive elastomer forming the interconnection elements 23 comprises an elastomeric material, including in turn micro or nano particles of conductive material 23p, as illustrated in FIGS. 4A and 4B. By way of example, the elastomeric material can be a silicone, which is filled with micro or nano particles of silver, even if other material can obviously be used.

In the above illustrated case, in which an elastomer charged with micro or nano particles of conductive material 23p is used, during the pressing of the interconnection elements 23, the particles 23p move from their rest position and contact the nearby particles. Furthermore, the peripheral particles 23p which are nearer to the contact pads 24 to be contacted exert, during pressing, a slight abrasive mechanical action onto the pad itself, so as to allow providing the desired electric contact. As illustrated in FIGS. 4A and 4B, passing from a rest condition to a pressing condition of the interconnection elements 23, the peripheral particles 23p thus exert an abrasive action onto the contact pads 24, moving thereon as indicated by the arrow F'.

Figure 5A:
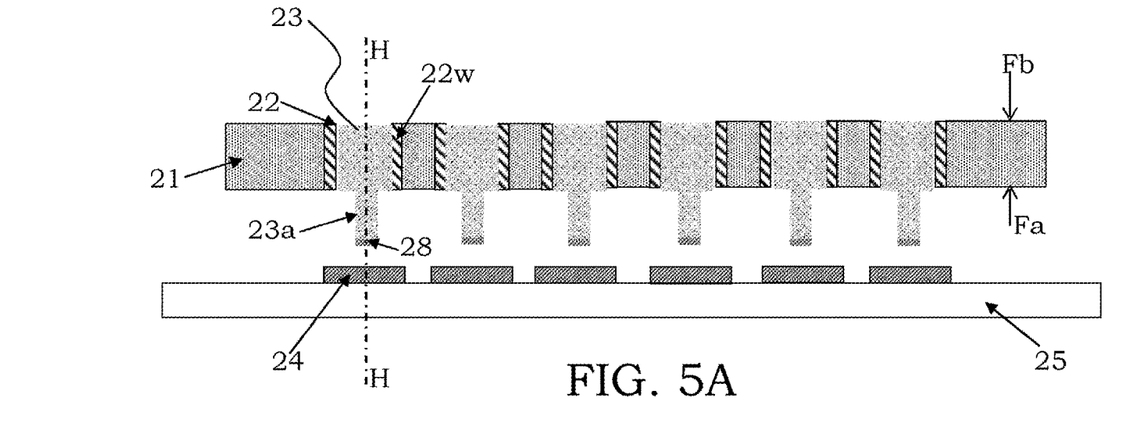
FIGS. 5A and 5B schematically show an interface element according to alternative embodiments of the present disclosure.

According to an embodiment, illustrated in FIG. 5A, a terminal portion of the protruding ends 23a and 23b also comprises a coating metal portion 28. In this way, the terminal portion of the ends 23a and 23b in contact with the contact pads of the device under test or of the space transformer is metallized, thus ensuring an improved electric connection of the interconnection elements 23 with the contact pads.

Figure 5B:
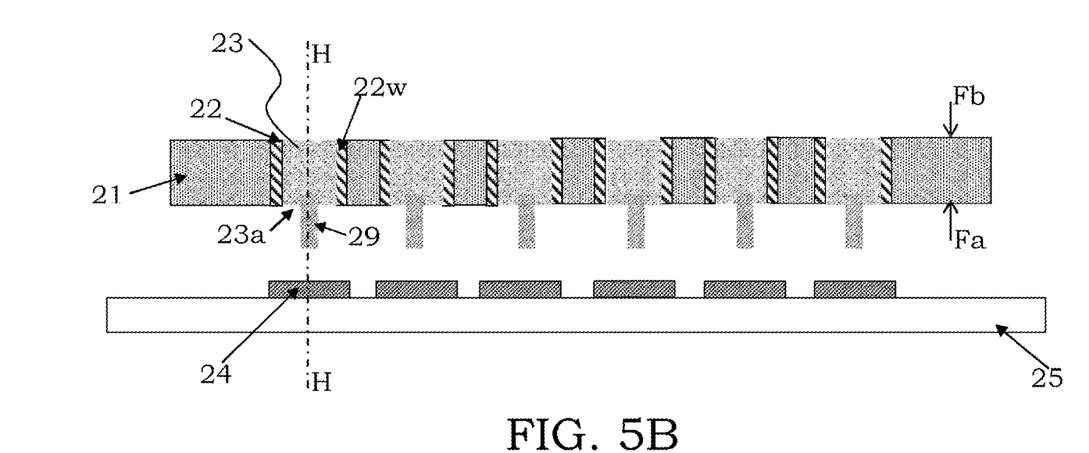

Furthermore, according to another embodiment, illustrated in FIG. 5B, at least one of the ends 23a or 23b of the interconnection elements 23 comprises a conductive contact element 29 (such as for instance a contact probe or a conductive foil) therein inserted. In particular, a first end portion of the conductive contact element 29 is inserted in the end 23a and/or 23b, whereas a second end portion, opposite the first end portion, of the conductive contact element 29 protrudes from the end 23a and/or 23b, the ends 23a and 23b not necessarily protruding from the openings 22 in this embodiment. By way of example, the conductive contact elements 29 can be contact probes equipped with a body extending between their first end portion and their second end portion, along a longitudinal axis parallel to the axis H-H. The ends 23a and 23b of the interconnection elements 23 may comprise suitable housing seats for housing the conductive contact elements 29. Alternatively, the conductive contact elements 29 may be forcibly inserted into the ends 23a and 23b of the interconnection elements 23.

The protruding end portion of the conductive contact elements 29 is adapted to contact the contact pads 24 of the device under test. Consequently, in this embodiment, the end 23a and/or 23b of the interconnection elements 23 contacts the contact pads 24 of the device under test through the conductive contact element 29 therein inserted.

The presence of the conductive contact element 29, which is completely conductive, further improves the electric contact with the contact pads 24 of the device under test, with respect to the coating metal portion 28 of FIG. 5A.

The conductive contact element 29 have a length, measured along the longitudinal axis H-H, comprised between 100 µm and 500 µm, whereas the interconnection elements 23 generally have a length comprised between 100 µm and 300 µm. It is thus evident that, also in the presence of the conductive contact elements 29, the interface element 20 of the present disclosure is particularly suitable for performing the test of high-frequency electronic devices.

It is once again noticed that, advantageously according to the present disclosure, one of the ends 23a or 23b of the interconnection elements 23 is adapted to contact the contact pads 24 of the device under test and the other end 23b or 23a is adapted to contact the contact pads 26 of the space transformer 27 associated with the interface element 20, which has a pitch between the interconnection elements 23 that cannot be obtained through the known solutions.

Obviously, the ends 23a and 23b of the interconnection elements 23 can also be adapted to contact contact pads of other components associated with the interface element 20 and between which the interface element 20 is arranged, thus providing the mechanical and electric connection between said components.

In general, the interface element 20 of the present disclosure is particularly versatile and can be associated simply and effectively with a probe card.

Figure 6:
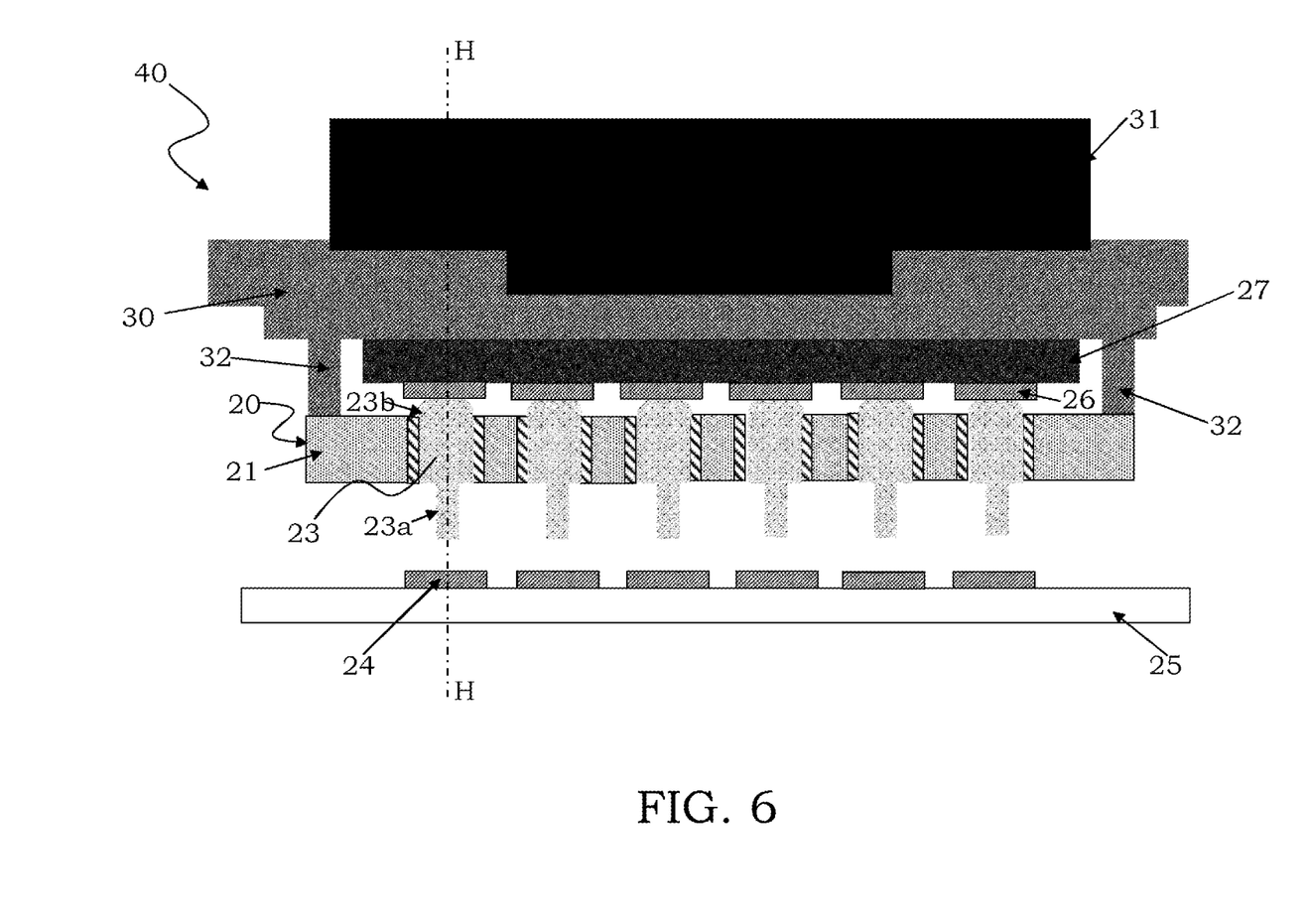
FIG. 6 schematically shows in section a probe card comprising the interface element according to the present disclosure.

FIG. 6 illustrates a probe card 40 for a testing apparatus of electronic devices realised according to a preferred embodiment of the present disclosure. In particular, the probe card 40 comprises the interface element 20 previously described and the space transformer 27. Furthermore, the probe card 40 comprises a PCB 30 adapted to interface with the testing apparatus, the PCB card 30 being associated with a stiffener 31 adapted to hold the probe card 40 in position. In this embodiment, the interface element 20 is suitably supported by a support element 32 connected to the support 21.

In FIG. 6 a preferred embodiment is illustrated, in which the interface element 20 is adapted to perform the contact with the contact pads 24 of the device under test integrated on the semiconductor wafer 25 through the interconnection elements 23, in particular through the first end 23a, and with the contact pads 26 of the space transformer 27 through the second end 23b. Obviously, as previously described, in an embodiment not illustrated in the figures, the interface element 20 may also act as an electric and mechanical connection element among different components of the probe card 40, for instance it may be arranged between the PCB 30 and the space transformer 27, if required by the circumstances.

Figure 7A:
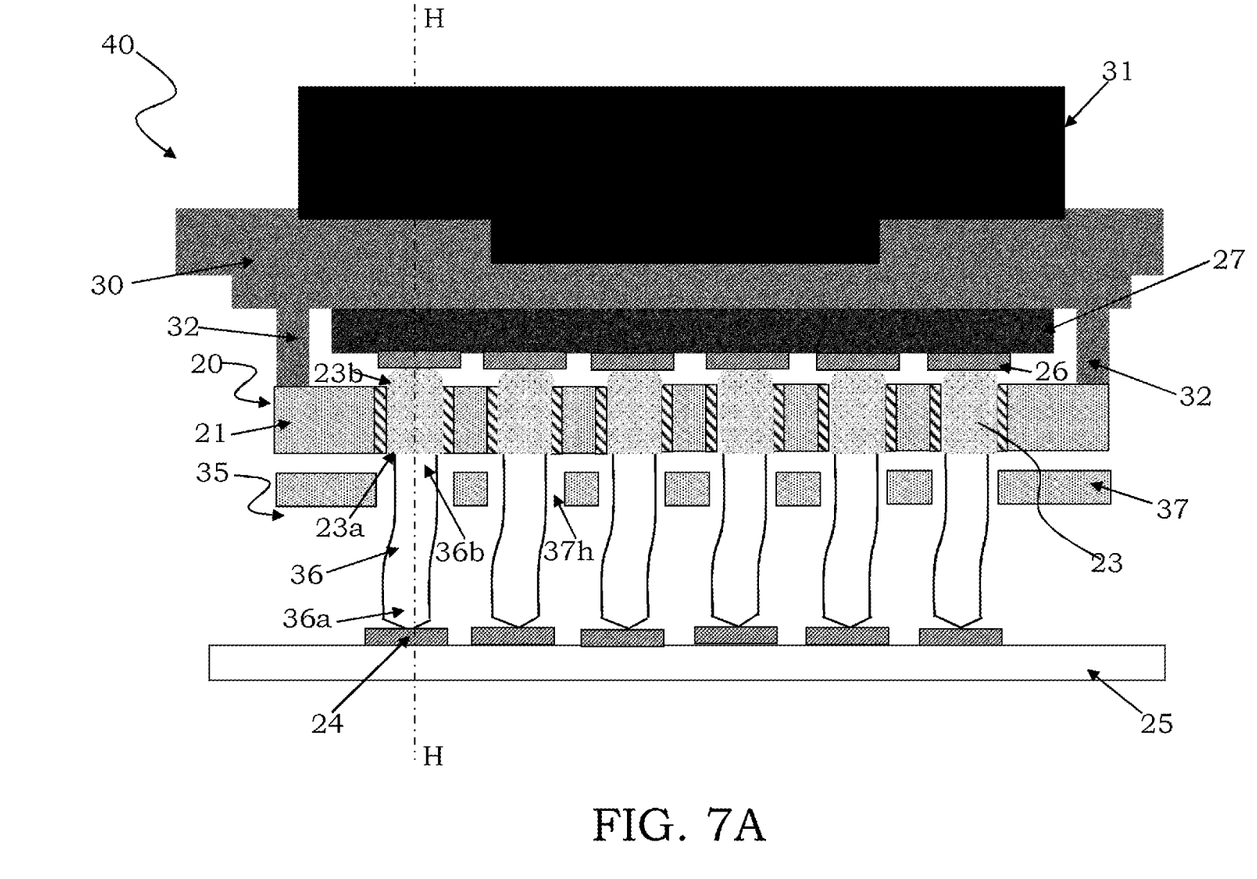
FIGS. 7A and 7B schematically show probe cards according to alternative embodiments of the present disclosure.

Furthermore, the embodiment of FIG. 5B can be generalized by providing a probe card 40 in which the interface element 20 is associated with a traditional vertical-probe testing head 35, in particular arranged between the testing head 35 and the space transformer 27, as illustrated in FIG. 7A.

The testing head 35 comprises a plurality of contact probes 36, in particular probes having a length less than at least 1 mm (for instance between 200 μm and 500 μm) for testing high-frequency devices, the contact probes 36 being housed in respective guide holes 37h formed in at least one guide 37. The contact probes 36 extend between a pitch portion 36a, which is adapted to contact the contact pads 24 of the device under test, and a head portion 36b, which is generally adapted to contact contact pads of a space transformer.

In the example of FIG. 7A, provided by way of non-limiting example of the scope of the present disclosure, the contact probes 36 are free-body probes held in the guide holes 37h of the guide 37 at the head portion 36b thereof, which protrudes superiorly from the guide 37. Suitably, it is possible to associate the protruding head portion 36b with the first end 23a of the interconnection elements 23 of the interface element 20.

For instance, it is possible to insert the head portion 36b of the contact probes 36 into the first end 23a of the interconnection elements 23, or, preferably, the head portion 36b may rest on the first end 23a. Even more preferably, the head portion 36b may comprise a portion protruding superiorly to be inserted into the first end 23a of the interconnection elements 23, the rest of the head portion 36b resting on the first end 23a, thus ensuring a better connection.

Thanks to the association between contact probes 36 and interconnection elements 23, it is possible to solve the problem of stiffness of the contact probes 36 thanks to the presence of the interface element 20 arranged between the testing head 35 and the space transformer 27, whose contact pads 26 are in contact with the second end 23b of the conductive interconnection elements 23, the reduced length of the interconnection elements 23 not adding noise to the signals carried by the contact probes 36. Such an embodiment further prevents an undesired breakage of the contact pads 26 of the space transformer 27 as well, the interface element 20 suitably damping the contact of the contact probes 36 thanks to the elasticity of the interconnection elements 23.

Figure 7B:
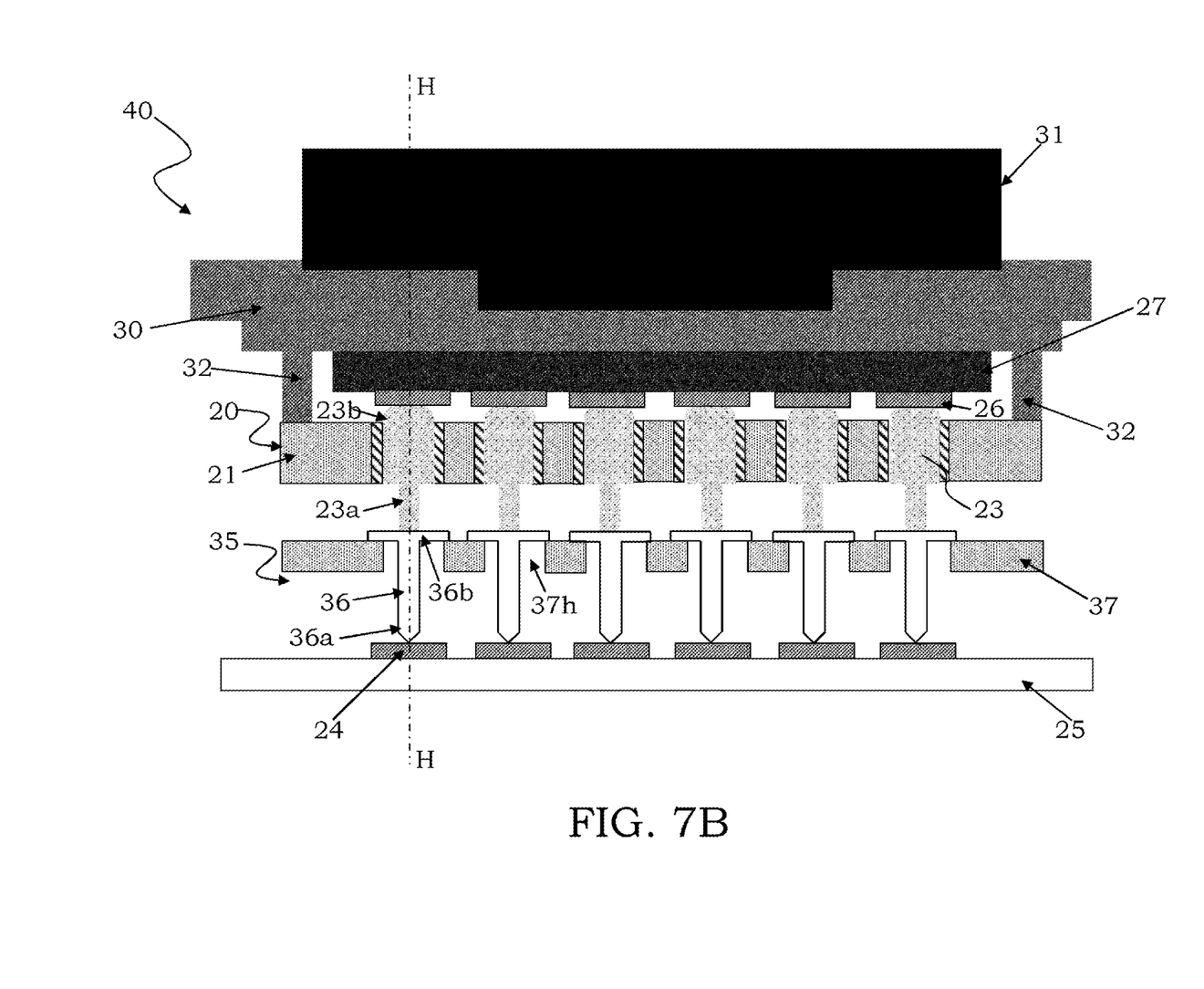

Furthermore, in an embodiment shown in FIG. 7B, the contact probes 36 of the testing head 35 are T-shaped (or mushroom-shaped), in which the head of the T is adapted to abut onto the first end 23a, which is protruding, of the interconnection elements 23. In other terms, the head of the T of the contact probes 36 corresponds to the head portion 36b associated with the interconnection elements 23. In this embodiment, the pressing of the contact probes 36 in the overdrive step determines the compression of the first end 23a of the interconnection elements 23, the head of the contact probes 36 ensuring an extensive abutting area onto the first end 23a, so as not to penetrate thereinto.

Now with reference to FIGS. 8A-8F, a method for manufacturing an interface element 20 for a testing apparatus of electronic devices is hereinafter described.

Figure 8A:
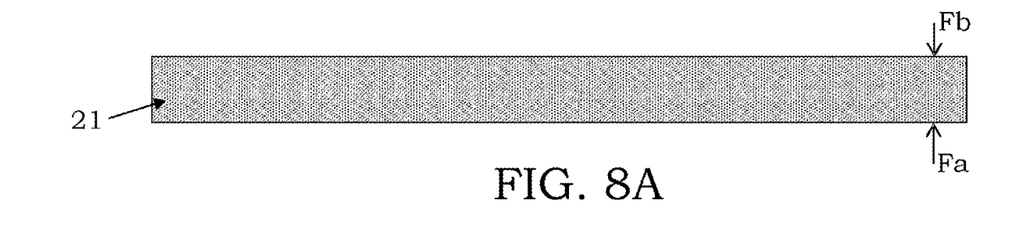
FIGS. 8A-8F schematically show steps of a manufacturing method of the interface element according to the present disclosure.

In particular, as illustrated in FIG. 8A, the method comprises a preliminary step of providing a substantially plate-like support 21, which is preferably made of a ceramic material or of a polyamide material, such as for instance Kapton or Mylar, even if other suitable materials are obviously possible.

Figure 8B:
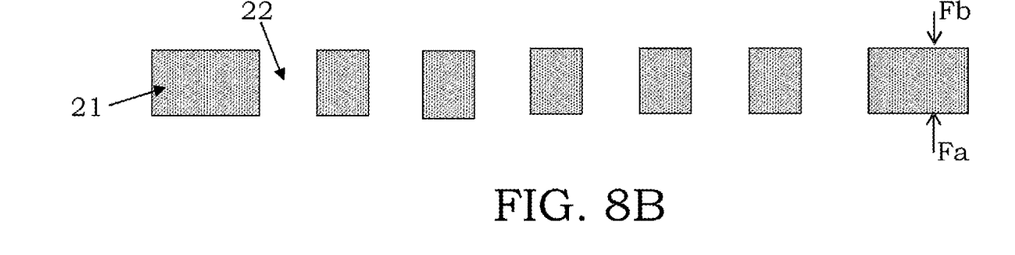

As illustrated in FIG. 8B, the method thus comprises a step of forming a plurality of through-openings 22 in the support 21.

Suitably, the step of forming the openings 22 is followed by a step of filling the openings 22 through a conductive elastomer, thus forming a plurality of interconnection elements 23 housed therein, each of the interconnection elements 23 forming a conductive channel between different and opposing faces Fa and Fb of the support 21, the face Fa being a lower face and the face Fb, opposite the face Fa, being an upper face according to the local reference of the figures.

The interconnection elements 23 thus comprise a first end 23a and a second end 23b for contacting contact pads of a device under test and/or contact pads of further components associated with the interface element 20 thus formed.

Figures 8C, 8D:
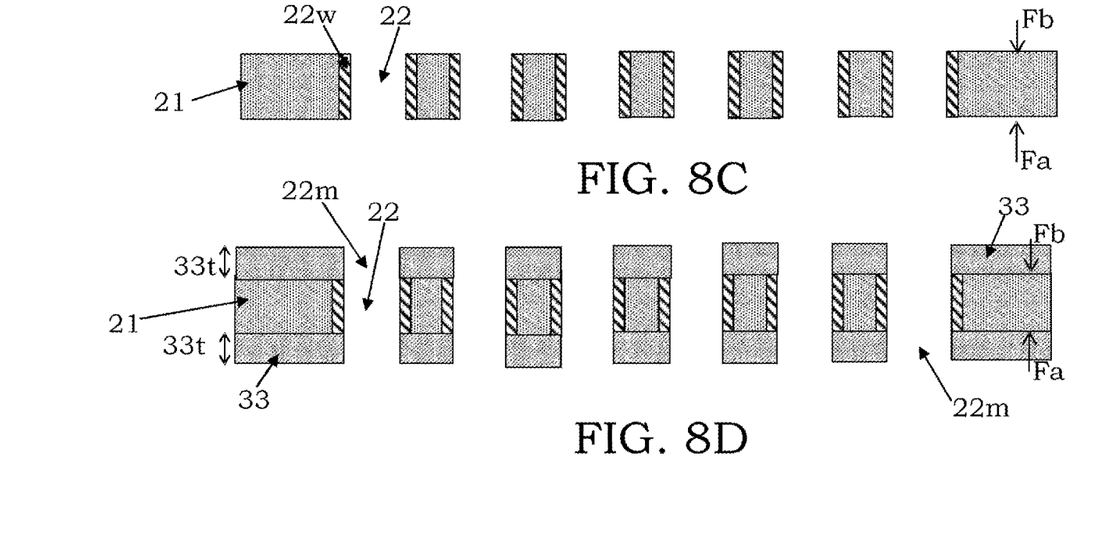

According to an embodiment, the step of filling the openings 22 is preceded by a step of depositing a conductive portion 22w onto at least one portion of the walls of the openings 22 of the support 21, preferably along the entire wall, as illustrated in FIG. 8C.

It is worth noticing that the metallization of the walls of the openings 22 is advantageous since it contributes improving the electric conductivity of the conductive channel formed by the interconnection elements 23.

As illustrated in FIG. 8D, the step of filling the openings 22 of the support 21 is preceded by a step of arranging a mask 33 onto at least one of faces Fa and Fb of the support 21, so as to be able to shape at will the ends 23a and 23b of the interconnection elements 23, in particular in terms of dimensioning of their heights and sections. To this end, the mask 33 is equipped with openings 22m at the openings 22 of the support 21.

Figure 8E:
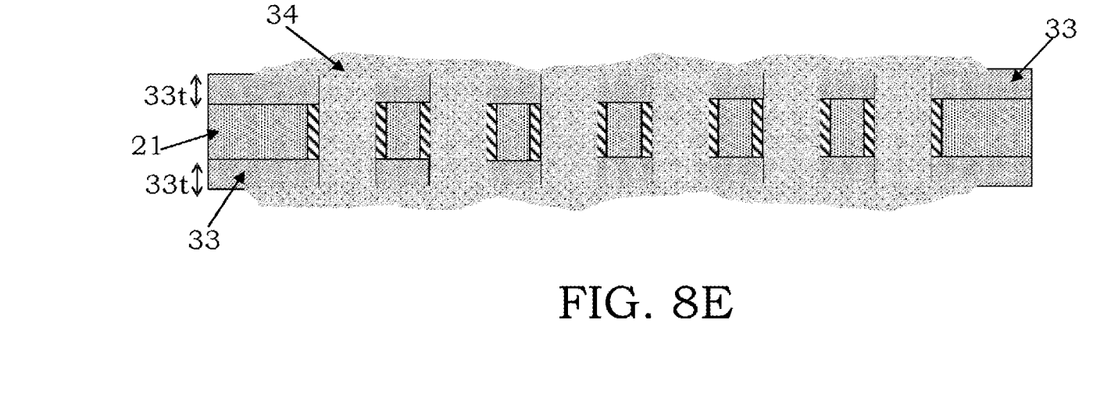
Figure 8F:
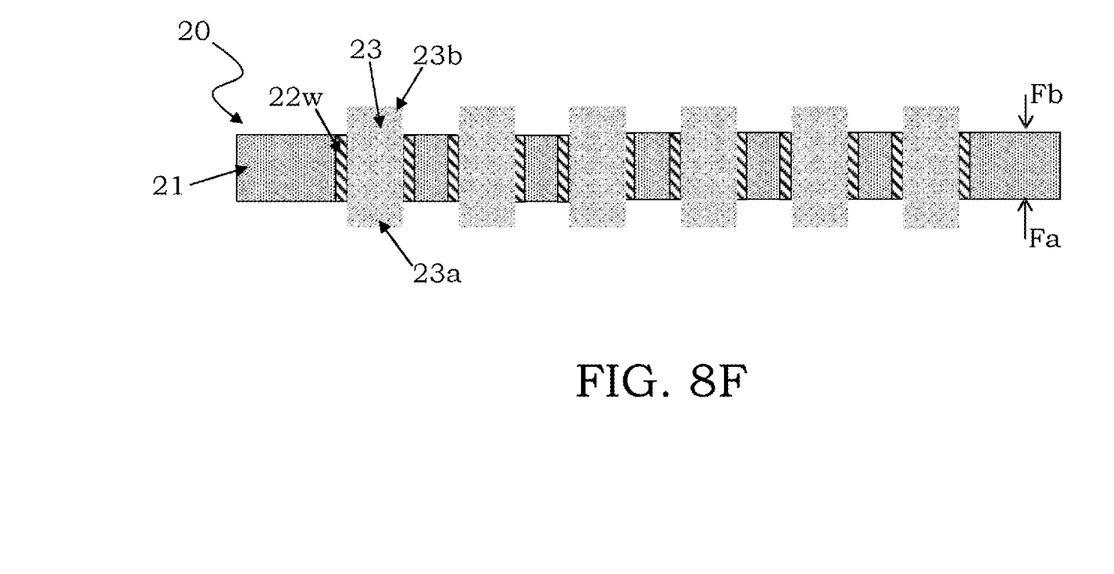

Once the openings 22 of the support 21 and the openings 22m of the mask 33 have been filled with a conductive elastomer 34, as illustrated in FIG. 8E, the exceeding conductive elastomer is removed and afterwards the mask 33 is also removed, forming the interface element 20 equipped with the plurality of interconnection elements 23 made of conductive elastomer, as shown in FIG. 8F.

Suitably, by modifying a thickness 33t of the mask 33 and a diameter of its openings 22m, it is possible to obtain ends 23a and 23b, protruding from the openings 22, of the interconnection elements 23 shaped at will according to the needs and/or necessity.

Figure 9A:
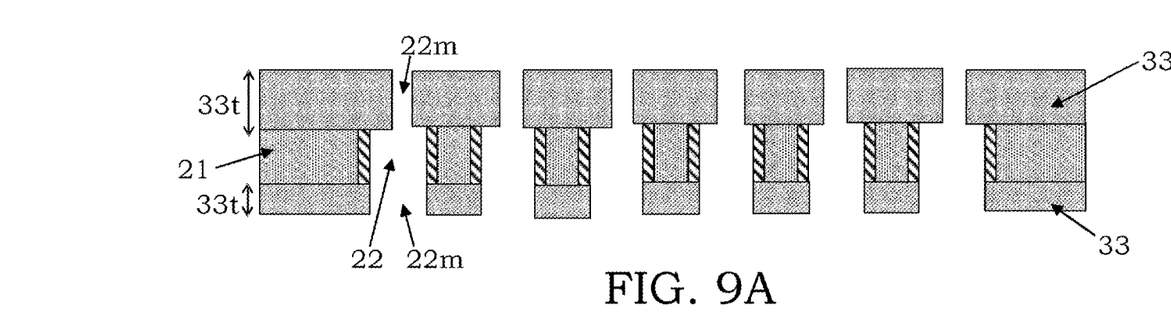
FIGS. 9A-9C schematically show steps of a manufacturing method according to an embodiment of the present disclosure.
Figure 9B:
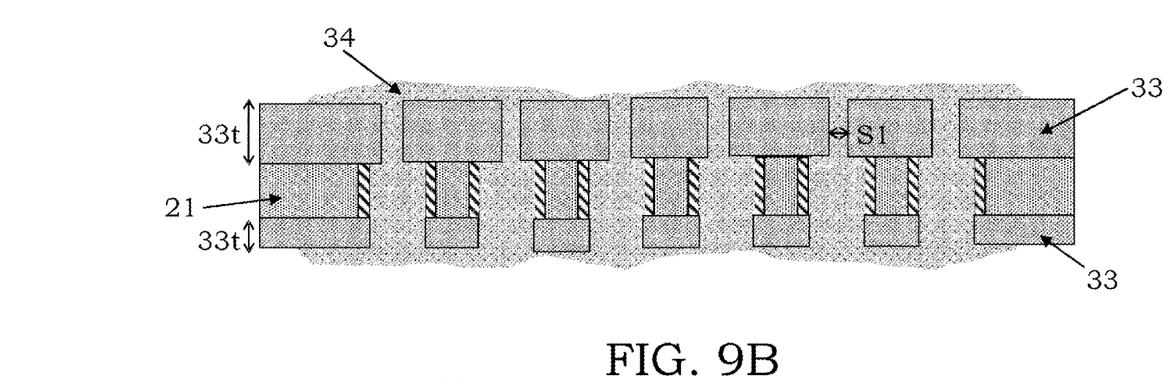
Figure 9C:
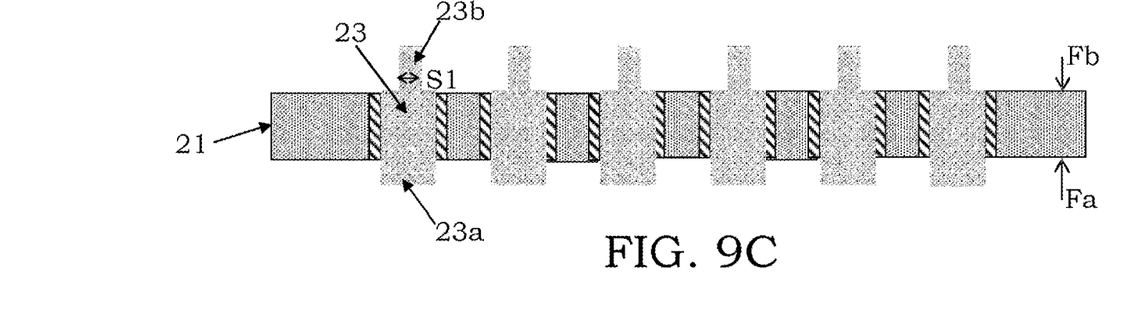

To this end, as illustrated in FIGS. 9A-9C, the method of the present disclosure comprises a step of selecting the thickness 33t of the mask 33 in order to select the length of the ends 23a and 23b of the interconnection elements 23 protruding from the openings 22. Analogously, a step of selecting the diameter of the openings 22m of the mask 33 is also provided, in order to select a section S1 of the protruding ends 23a and 23b, forming in particular the ends 23a and 23b with a reduced section with respect to the body of the interconnection elements 23, so as to avoid an undesired electric connection between the ends while the interface element 20 presses for instance onto contact pads of a device under test.

In particular, it is thus possible to choose different thicknesses and diameters of the openings at faces Fa and Fb, as illustrated in FIGS. 9A-9C. In other terms, through the morphology of the mask 33 it is possible to obtain protruding ends 23a and 23b calibrated with different geometries and different dimensions according to the needs and/or necessity.

In the example of FIGS. 9A-9C, the end having reduced section is end 23b, even if the same shape may obviously be chosen for end 23a.

The step of filling the openings 22 of the support 21 is performed through a polymerization process. In particular, according to a preferred embodiment, a polymer/catalyst in the liquid state poured onto the area of interest is used, in particular into the openings 22 of the support 21 and into the openings 22m of the mask 33.

The polymerization process varies according to the elastomeric material being used, for instance it may be performed by means of thermal cycles, UV exposition or in any other suitable way.

By way of example, the elastomeric material may be a silicone, which is filled with micro or nano particles of silver, even if other materials may obviously be used.

It is thus clear that the method of the present disclosure allows forming an interface element 20 comprising a high number of interconnection elements 23 in a very short time, the interconnection elements 23 being formed simultaneously by means of the above method, turning out to be correctly positioned and distanced apart thanks to the provision of the openings 22 where desired.

In conclusion, the present disclosure provides an interface element wherein a plurality of through-openings formed in a support thereof is filled with a conductive elastomer, whose end portions are adapted to contact contact pads of a device under test and/or of components of a probe card which the interface element is associated with, the pressing of the conductive elastomer onto the contact pads allowing the desired mechanical and electric connection.

Advantageously according to the present disclosure, it is possible to form an interface element whose contact elements are the interconnection elements made of elastomeric material, the length of which is such as to allow an effective working even at radio frequencies without adding noise to the carried signals.

In fact, it is pointed out that, according to the present disclosure, the interconnection elements of the interface element have a length less than at least 300 µm.

The interconnection elements further have an elasticity able to ensure a correct damping of the contact with the contact pads of a device under test or of a space transformer, overcoming the problem of stiffness and of the high probability of breakage of the prior art short probes, meanwhile ensuring a proper reduction of the pressure onto the contact pads, thus avoiding a breakage thereof.

Consequently, the interface element of the present disclosure on the one hand allows testing the electronic devices for high-frequency applications, on the other hand it allows avoiding the breakage of the contacts elements thereof and/or of the contact pads of the devices under test or of the space transformer, the elasticity of the interconnection elements ensuring the removal of any tangential and longitudinal stress onto the contact pads.

Also in case the terminal portions of the ends of the interconnection elements are coated with a coating conductive material, the absence of tangential stresses onto the contact pads of the device under test or of the space transformer is in any case always ensured.

The interface element of the present disclosure, though able to perform the test of electronic devices even with a very low pitch, is in any case very versatile and may be also used as a mechanical and electric connection element among different components of a probe card.

It is also pointed out that the proposed interface element may be easily removed and replaced if required by the circumstances and/or necessity, allowing an easy re-configuration of the probe card which it interfaces with. Consequently, once the interface element has been associated with a probe card, also its removal and replacement is particularly easy and quick.

Furthermore, advantageously according to the present disclosure, the method described allows an extremely quick and cheap manufacturing of the interface element, since in a short time it is possible to simultaneously form a high number of interconnection elements by depositing an elastomeric material directly into the openings of the support, without needing to proceed to an assembly process of the pick and place type of the interconnection elements, with a consequent reduction of the assembly time.

This method allows forming an interface element in which the pitch between the interconnection elements is greatly reduced. The possibility to reduce the pitch thus allows testing electronic devices directly through the interface element, in which the interconnection elements are adapted to contact the contact pads of the device, the interconnection elements being very short and elastic. The possibility to contact contact pads of a device under test with elastomers is thus a distinctive feature of the present disclosure, even if the proposed interface element is particularly versatile and may also be used simply as mechanical/electric interface in a probe card, as well as it may also be suitably associated with short probes of a testing head.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An interface element for a testing apparatus of electronic devices, the interface element comprising a support provided with a plurality of through openings that house respective interconnection elements, which extend between a first end and a second end, wherein the interconnection elements are made of a conductive elastomer that fills the openings, each of the interconnection elements forming a conductive channel between different and opposing faces of the support,
wherein at least one end of the first end and the second end of the interconnection elements protrudes from the openings,
wherein the at least one end protruding from the openings has a section that is less than a section of a portion of the interconnection elements housed inside said openings, and
wherein the section of the at least one end protruding from the openings is configured to allow a deformation thereof while pressing onto the contact pads of the device under test in such a way that there is no electric connection between adjacent interconnection elements.

2. The interface element according to claim 1, wherein a terminal portion of the at least one end protruding from the openings comprises a coating metal portion.

3. The interface element according to claim 1, further comprising conductive contact elements each including a first end portion inserted into at least one of the ends of a respective one of the interconnection elements and a second end portion, opposite the first end portion, protruding from the at least one of said ends of the respective one of the interconnection elements.

4. The interface element according to claim 1, wherein the interconnection elements have a length between 100 µm and 300 µm, said length being measured along a longitudinal axis of the interconnection elements.

5. The interface element according to claim 1, wherein the conductive elastomer forming the interconnection elements comprises an elastomeric material in turn including micro or nano particles of conductive material.

6. The interface element according to claim 1, further comprising conductive portions respectively coating at least one portion of walls of the openings.

7. The interface element according to claim 1, wherein the first ends of the interconnection elements are adapted to contact contact pads of a device under test, and the second ends of said interconnection elements are adapted to contact contact pads of a space transformer associated with the interface element.

8. The interface element according to claim 1, wherein the ends of the interconnection elements are adapted to contact pads of components associated with the interface element and between which the interface element is arranged, the interface element providing mechanical and electrical connection among said components.

9. A probe card for a testing apparatus of electronic devices, comprising:
a component that includes a plurality of conductive contact pads; and
the interface element according to claim 1, the interconnection elements of said interface element being configured to make contact with the contact pads of the component.

10. The probe card according to claim 9, wherein the component is a space transformer and the probe card further comprises a testing head that comprises a guide and a plurality of contact probes, each having a tip portion configured to contact a respective contact pad of a plurality of contact pads of a device under test and a head portion, the contact probes being housed respectively in guide holes of the guide, the head portions of the contact probes being associated with the first ends of the interconnection elements, and the interface element being arranged between the space transformer and the test head.

11. The probe card according to claim 10, wherein the contact probes are T-shaped, and have respective head portions adapted to abut onto the protruding first ends of the interconnection elements, respectively.

12. A method for manufacturing an interface element for a testing apparatus of electronic devices, the method comprising:
providing a substantially plate-like support;
forming a plurality of through openings in the support; and
filling the openings by a conductive elastomer, forming a plurality of interconnection elements housed in the openings, the interconnection elements extending between a first end and a second end,
wherein each of the interconnection elements forms a conductive channel between different and opposing faces of the support,
the method further comprising arranging a mask on at least one of the faces of the support and selecting a thickness of the mask, the mask having openings at the openings of the support, wherein filling the openings in the support includes filling the openings in the mask in order to form the first ends protruding from the support to a length equal to the thickness of the mask.

13. The method according to claim 12, further comprising selecting a diameter of the openings of said mask to be less than a diameter of the openings in the support, wherein filling the openings in the support includes filling the openings in the mask in order to form the first ends protruding from the support, the first ends having a reduced cross-section compared to a cross-section of bodies of the interconnection elements that are positioned in the openings in the support.

14. The method according to claim 12, wherein filling the openings of the support is performed using a polymerization process.

15. The method according to claim 14, wherein the polymerization process is performed using thermal cycles.

16. The method according to claim 12, further comprising depositing conductive portions respective onto at least one portion of the walls of the openings of the support.

* * * * *